(12) United States Patent
Krug et al.

(10) Patent No.: US 7,242,236 B2
(45) Date of Patent: Jul. 10, 2007

(54) MIXER CIRCUIT WITH PHASE-SHIFTED RADIO FREQUENCY SIGNAL

(75) Inventors: Erwin Krug, Munich (DE); Walter Zimmermann, Dorfen (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 11/158,933

(22) Filed: Jun. 22, 2005

(65) Prior Publication Data

US 2006/0001472 A1    Jan. 5, 2006

(30) Foreign Application Priority Data

Jun. 22, 2004    (DE) ...................... 10 2004 030 039

(51) Int. Cl.
*G06G 7/16*    (2006.01)
(52) U.S. Cl. ................... 327/356; 327/359; 455/333
(58) Field of Classification Search ............... 327/356, 327/359; 455/326, 333
See application file for complete search history.

(56) References Cited

U.S. PATENT DOCUMENTS 5,379,457 A * 1/1995 Nguyen ..................... 455/323
6,026,286 A * 2/2000 Long ......................... 455/327
6,472,925 B1 10/2002 Komurasaki et al. ....... 327/361

FOREIGN PATENT DOCUMENTS

DE    197 08 007 A1    2/1998
DE    102 39 856 A1    3/2004

OTHER PUBLICATIONS

"Taschenbuch der Hochfrequenztechnik", Meinke, Gundlach, Springer-Verlag, 5th Edition, 1992, p. Q22.

* cited by examiner

*Primary Examiner*—Kenneth B. Wells
(74) *Attorney, Agent, or Firm*—Maginot, Moore & Beck

(57) ABSTRACT

A mixer includes two transistor circuits, two control inputs, two RF inputs and two IF outputs, wherein, for switch-support, there are provided positive feedback elements and impedance elements, by which intermodulation strength, stability and noise performance of the mixer circuit are improved.

20 Claims, 5 Drawing Sheets

US 7,242,236 B2

MIXER CIRCUIT WITH PHASE-SHIFTED RADIO FREQUENCY SIGNAL

CROSS-REFERENCE TO RELATED APPLICATION

This application claims priority from German Patent Application No. 10 2004 030 039.9, which was filed on Jun. 22, 2004, and is incorporated herein by reference in its entirety.

BACKGROUND OF THE INVENTION

1. Field of the Invention

The present invention relates to mixer circuits and particularly to mixer circuits for processing television/video signals.

2. Description of the Prior Art

FIG. 5 shows a push-pull mixing stage with bipolar transistors, such as described in "Taschenbuch der Hochfrequenztechnik", Meinke, Gundlach, Springer-Verlag, $5^{th}$ edition, 1992, page Q22. The active mixing stage includes a first bipolar transistor T11 500, a second bipolar transistor T12 502, a third bipolar transistor T21 504, and a fourth bipolar transistor T22 506. The bipolar transistors are respectively arranged as two transistor circuits such that the two transistors T11, T12 are connected to each other in the first transistor circuit so that their emitters are coupled, wherein the coupled emitters of the two transistors T11, T12 represent the RF input. The transistor circuit formed by the two transistors T11, T12 is controllable by two control inputs, i.e. the base terminals of the two transistors, wherein a local oscillator signal may be applied to the base terminal of the first transistor T11, and wherein an inverted local oscillator signal may be applied to the base terminal of the second transistor T12, i.e. the second control input. Analogously, the positive local oscillator signal LO and the negative local oscillator signal LO_ are coupled to the two transistors T21, T22 of the second transistor stage so that the negated local oscillator signal is applied to the base terminal of the transistor T21 of the right-hand transistor circuit, and wherein the local oscillator signal is applied in non-inverted state to the second control input of the second transistor stage, i.e. to the second transistor T22. Thus, also the second transistor circuit formed by the two transistors T21, T22 has an RF input, which is again at the coupled emitters, in addition to the two control inputs, i.e. the base terminals of the transistors 504 and 506.

Both transistor circuits have two IF outputs. Thus, the collector terminal of the first transistor, i.e. the transistor also providing the first control input, represents the IF output (in non-inverted state), while the collector terminal of the second transistor represents a second IF output at which the IF signal may be taken in inverted state. Analogously, the second transistor circuit is formed by the transistors 504 and 506. The left-hand transistor T21 represents the IF output, while the right-hand transistor T22 represents the inverted IF output.

In addition to the two transistor circuits described above, the known mixer shown in FIG. 5 also includes an RF supply stage formed by the two transistors T1 and T2. The positive RF signal may be supplied to a control input of the first transistor T1, while the inverted RF signal may be supplied to the control input of the second transistor T2. Further, there is a current source means Idc.

The mixing stage illustrated in FIG. 5 is thus based on two push-pull mixing stages, each formed with two npn transistors. The drive thus takes place by the RF supply stage. In other words, the transistor T1 controlled by the RF signal and the direct current source Idc may together be regarded as controlled current source providing both the RF signal and the supply current. The local oscillator signal required for frequency conversion, as mentioned above, is supplied to the base terminals of the transistors and selected so large that the transistors operate in switching mode.

The circuit shown in FIG. 5 is particularly well suited for monolithic integration. Input signal RF and oscillator signal LO are each supplied in push-pull, and the intermediate frequency is taken in a balanced way. Thus a reduction of the even order intermodulation products and a suppression of the oscillator signal are achieved. Good balancing is achieved in active mixing stages when the transistor parameters of the transistors used in the left-hand and right-hand branches are as equal as possible.

In the mixer circuit shown in FIG. 5, the two transistors T11 and T12 are actually switched back and forth with the local oscillator signal. This maintains the non-linearity resulting in the frequency conversion. Particularly for applications at higher frequencies or also for applications expecting high linearity, a problem is that the transistors do not switch synchronously with each other due to real parameter variations, etc., wherein the problem is aggravated when going to higher frequencies. However, due to the controllability of the circuit design, it is preferred, on the other hand, to use transistor mixers instead of diode mixers or varactor mixers.

Furthermore, the intermodulation strength of mixers and, particularly, of balanced and double-balanced mixers suffers particularly when the transistor parameters of the two transistors in a transistor circuit, and, in the case of the double-balance mixers, the transistor parameters of the transistors in the two amplifier circuits differ, which, in turn, becomes more and more noticeable when going to higher frequencies.

A lower intermodulation strength, in other word, an increase in energy in unwanted intermodulation products, results in reduced linearity and an unwanted interference of the IF signal.

SUMMARY OF THE INVENTION

It is the object of the present invention to provide a mixer circuit with less interference.

The present invention provides a mixer circuit configured to be coupled to a first local oscillator signal and a second local oscillator signal which is phase-shifted with respect to the first local oscillator signal. The mixer circuit has a first transistor circuit with a first control input, a second control input, a first radio frequency input and a first intermediate frequency output, wherein the first local oscillator signal is applied to the first control input, wherein the second local oscillator signal is applied to the second control input; a second transistor circuit coupled to the first control input and the second control input and having a second radio frequency input for a radio frequency signal which is phase-shifted with respect to a radio frequency signal at the first radio frequency input of the first transistor circuit, and having a second intermediate frequency output for an intermediate frequency signal which is phase-shifted with respect to an intermediate frequency signal at the first intermediate frequency output; a first positive feedback element connected between a first intermediate node and the second control input; a second positive feedback element connected between a second intermediate node of the second transistor circuit and the second control input; a first impedance element connected between the first intermediate node and the first intermediate frequency output; and a second impedance element connected between the second intermediate node and the second intermediate frequency output.

According to another aspect of the disclosure, a mixer circuit for coupling to a first local oscillator signal and a second local oscillator signal which is phase-shifted with respect to, but has the same frequency as, the first local oscillator signal is provided. The mixer circuit comprises a first transistor circuit, a second transistor circuit, a first capacitive feedback element and a second capacitive feedback element. The first transistor circuit has a first input coupled to the first oscillator signal and a second input coupled to the second oscillator signal, a first radio frequency input and a first intermediate frequency output. The second transistor circuit has a third input coupled to the first oscillator signal and a fourth input coupled to the second oscillator signal, a second radio frequency input for a radio frequency signal which is phase-shifted with respect to a radio frequency signal at the first radio frequency input of the first transistor circuit, and a second intermediate frequency output for an intermediate frequency signal which is phase-shifted with respect to an intermediate frequency signal at the first intermediate frequency output. The first capacitive feedback element is connected between a first intermediate node coupled to the first intermediate frequency output and the second control input. The second capacitive feedback element is connected between a second intermediate node coupled to the second intermediate frequency output of the second transistor circuit and the second control input.

The present invention is based on the finding that an increase of the intermodulation strength of double-balanced mixers may be achieved by a positive feedback between the IF input and a control input of the amplifier stage. The positive feedback elements, preferably capacitive positive feedback elements, have a switch-supporting effect and, at the same time, lead to an improvement in intermodulation strength.

In a preferred embodiment of the present invention, the coupling elements are each realised as a discrete integrated capacitor or as a line of a determined length so that the line has a negative impedance and thus a capacitive property.

Furthermore, both the first intermediate frequency output and the second intermediate frequency output are connected to impedance elements which, in turn, are coupled to the positive feedback elements to further improve the switch-supporting effect of the capacitances.

The positive feedback elements and the impedance elements have a switch-supporting and/or switch-stabilizing effect, resulting directly in an improvement in intermodulation strength.

In a preferred embodiment, switch-stabilizing positive feedback capacitors are used by each collector for the counterpart base of a mixer cell. Preferably, the capacitors are integrated monolithically and thus do not represent additional effort.

It is further preferred to implement the transistors of the transistor circuits integrally, wherein, depending on the requirements with respect to performance, etc., on layout level, each discretely described transistor may also be implemented of several individual transistors coupled to each other, which together behave as one transistor with corresponding characteristic parameters.

In a preferred embodiment of the present invention, there is further achieved a mirror suppression by connecting a frequency selective network between the RF supply stage and ground.

In a further preferred embodiment of the present invention, cascoding is established on the IF side with additional cascoding transistors in addition to the mirror suppression.

In still another embodiment of the present invention, there is further employed a frequency response linearization, in addition to the cascoding and the mirror frequency suppression, wherein preferably a resistive/capacitance parallel circuit is used upstream to the mirror frequency suppression circuit.

BRIEF DESCRIPTION OF THE DRAWINGS

Preferred embodiments of the present invention will be explained in detail in the following with reference to the accompanying drawings, in which.

DESCRIPTION OF THE PREFERRED EMBODIMENTS

Figure 1:
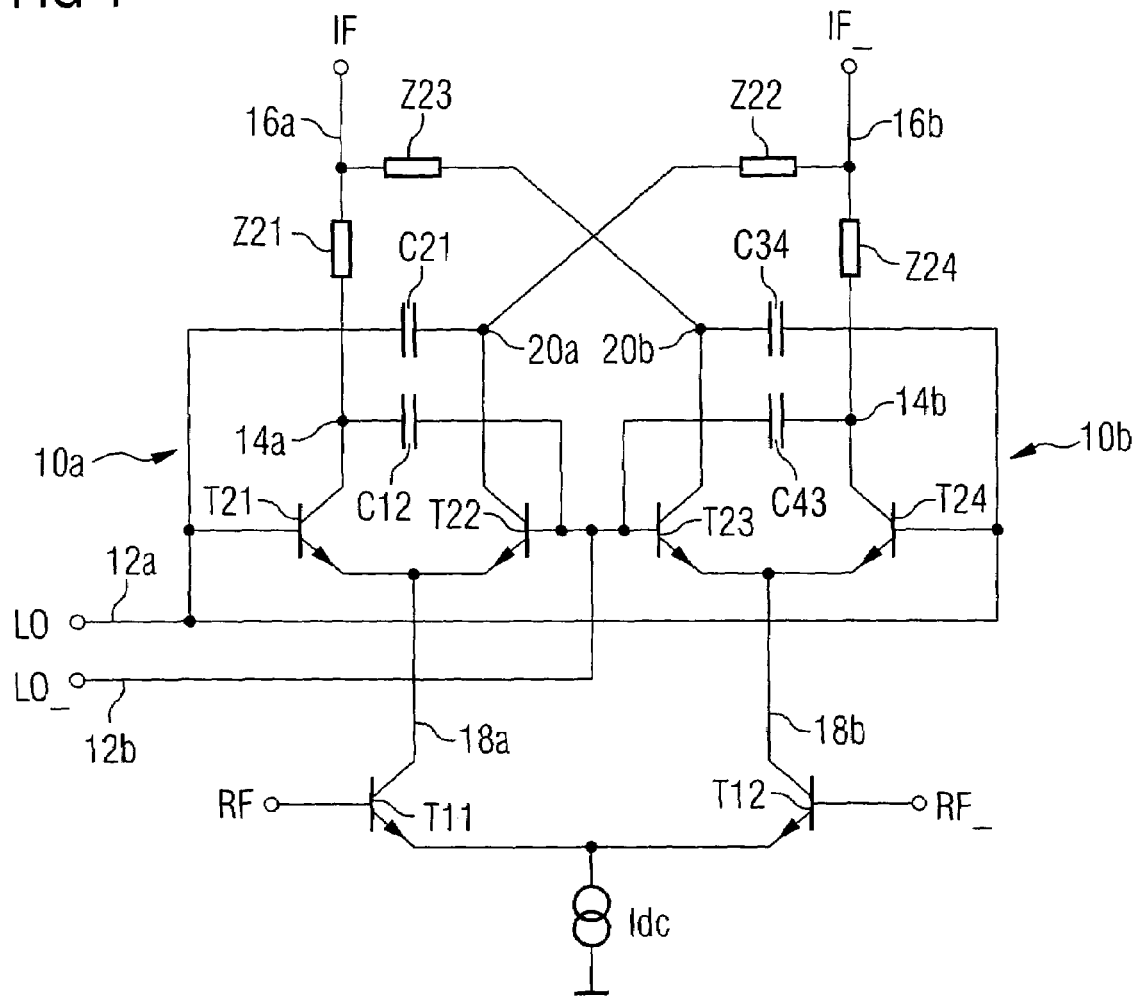
FIG. 1 shows a mixer with switch-supporting positive feedback capacitors according to a preferred embodiment of the present invention.

FIG. 1 shows a mixer circuit according to an embodiment of the present invention, wherein the mixer circuit comprises two transistor circuits 10a, 10b including one or more transistors. Each circuit has a first control input 12a, a second control input 12b, and an IF output 16a and 16b, respectively, and a first RF input 18a and a second RF input 18b, respectively. A local oscillator signal LO and/or LO_ may be applied to the first control input 12a and to the second control input 12b, wherein it is preferred that the LO signal applied to the first control input 12a has a determined phase, and that the LO_ signal applied to the second control input 12b has a phase which is phase-shifted by 180° with respect to the phase of the signal applied to the first control input. An exact phase-shift of 180°, however, is not essential for the functionality of the mixer. For example, functionality is ensured, even though increasingly deteriorating, when there are deviations from a 180° phase-shift.

According to the invention, an impedance element is connected between each IF output 16a, 16b and an intermediate node, wherein, in turn, the positive feedback elements are arranged between an intermediate node and the first and the second control inputs, respectively.

Preferably, a positive feedback element is implemented as discrete capacitor which is additionally integrated to the transistor circuit 10. Alternatively, however, a line may be used which has a negative impedance at operating frequency and is, thus, operated capacitively, if it can be realised due to the operating frequency.

With respect to the dimensioning of a positive feedback element and, particularly, with respect to the dimensioning of the capacitance, a capacitance in the range of 0.2 to 10 pF is preferred, wherein this range is preferred for an RF frequency in the range of television frequencies.

In the following, the preferred embodiment of the present invention of FIG. 1 is illustrated in more detail.

The preferably completely balanced mixer circuit has a first transistor circuit 10a with a first control input 12a, a second control input 12b, a first radio frequency input 18a and a first intermediate frequency output 16a, wherein a first local oscillator signal LO may be applied to the first control input 12a, wherein a second local oscillator signal LO_, which is phase-shifted with respect to a first local oscillator signal LO and has the same frequency as the first local oscillator signal, may be applied to the second control input 12b.

The mixer further includes a second transistor circuit 10b coupled to the first control input 12a and the second control input 12b, and which comprises a second radio frequency input 18b for a radio frequency signal RF_, which is phase-shifted with respect to a radio frequency signal RF at the first radio frequency input 18a of the first transistor circuit 10a, and which comprises a second intermediate frequency output 16b for an intermediate frequency signal IF_, which is phase-shifted with respect to an intermediate frequency signal IF at the first intermediate frequency output.

Further, there are provided a first positive feedback element C12 connected between a first intermediate node 14a and the second control input 12b, and a second positive feedback element C43 connected between a second intermediate node 14b of the second transistor circuit 10b and the second control input 12b.

In addition, the inventive mixer includes a first impedance element Z21 connected between the first intermediate node 14a and the first intermediate frequency output 16a, and a second impedance element Z24 connected between the second intermediate node 14b and the second intermediate frequency output 16b.

In a preferred embodiment of the present invention, the mixer is designed completely balanced and further includes a third positive feedback element C21 connected between a third intermediate node 20a and the first control input 12a, and a fourth positive feedback element C34 connected between a fourth intermediate node 20b of the second transistor circuit 10b and the first control input 12a.

Furthermore, there are also a third impedance element Z22 connected between the third intermediate node 20a and the second intermediate frequency output 16b, and a fourth impedance element Z23 connected between the fourth intermediate node 20b and the first intermediate frequency output 16a.

The RF signal is supplied in a balanced way, namely to the control terminals of two transistors T11 and T12, also preferably implemented as bipolar transistor, which form a transistor stage and operate to modulate the current supplied by the current source Idc according to the RF signal.

The positive feedback effect is achieved because, as the potential—with respect to the second transistor circuit 10b—at the first control terminal 12a increases, the potential at the second intermediate node 20b also increases, wherein, however, the potential at the first intermediate node 14b decreases. The behaviour of the potentials with respect to the first transistor circuit 10a is analogous.

The mixer circuit in FIG. 1 further includes a radio frequency supply stage with the two transistors T11, T12, wherein the supply stage, as is to be seen from FIG. 1, has a first output for the radio frequency signal and a second output for a radio frequency signal which is phase-shifted with respect to said radio frequency signal and has the same frequency as said radio frequency signal. The supply stage further includes the current source Idc connected between the two (emitters of the) transistors and ground. The emitters of the transistors are connected to each other. In other embodiments, the transistors may also be installed the other way round, so that the collectors are connected and the emitters are coupled to the transistors of the transistor circuits.

FIG. 1 thus shows a completely designed push-pull mixer with switch-supporting positive feedback capacitors between the control terminal of one transistor and the collector terminal of the other transistor within a transistor circuit, and impedance elements coupled to the two IF outputs 16a, 16b.

Figure 5:
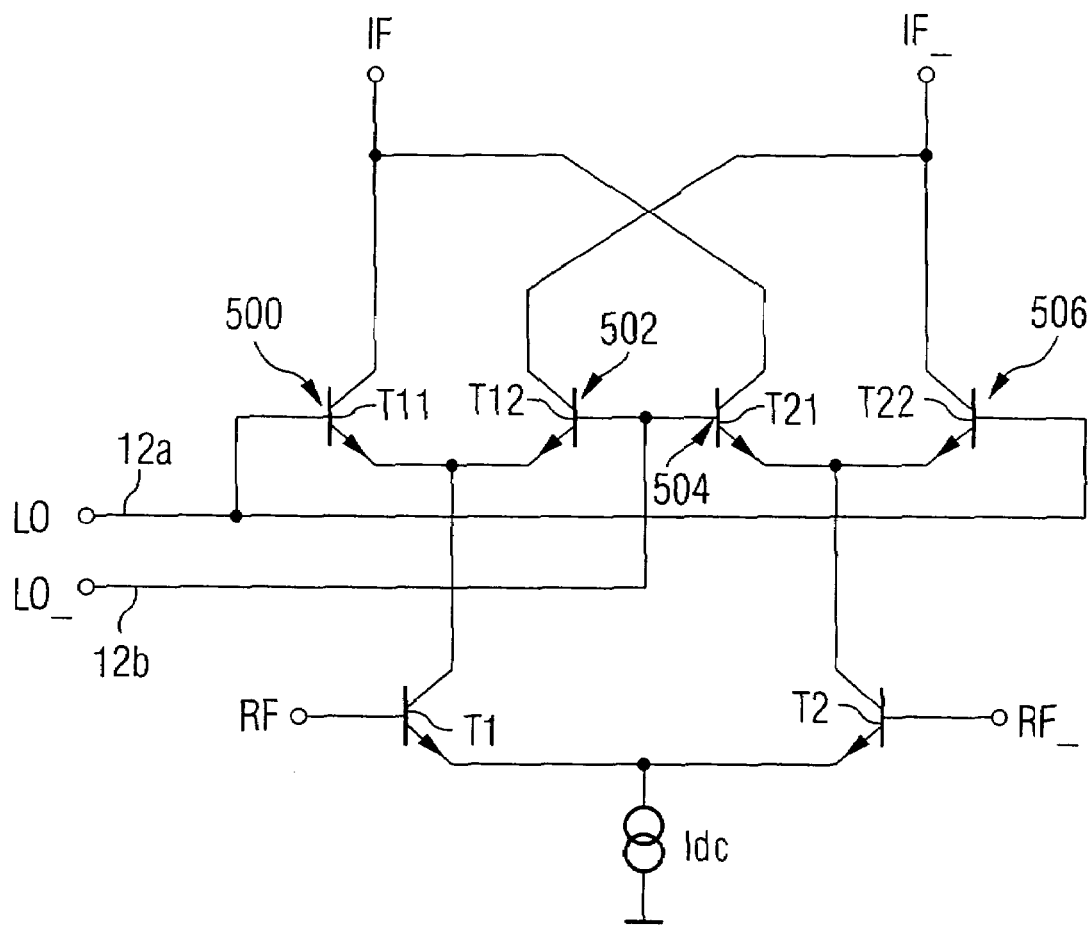
FIG. 5 shows a monolithically integrated mixing stage in which the input signal and the oscillator signal are supplied in push-pull, and the intermediate frequency is taken in a balanced way.

In FIG. 1, the transistor circuit, as already explained with respect to FIG. 5, consists of two transistors whose emitters are coupled to each other, and at whose respective IF terminals the IF signal may be taken in a balanced way, wherein the LO signal is supplied to the first control input in a non-inverted state and is supplied to the second control input in an inverted state.

Figure 2:
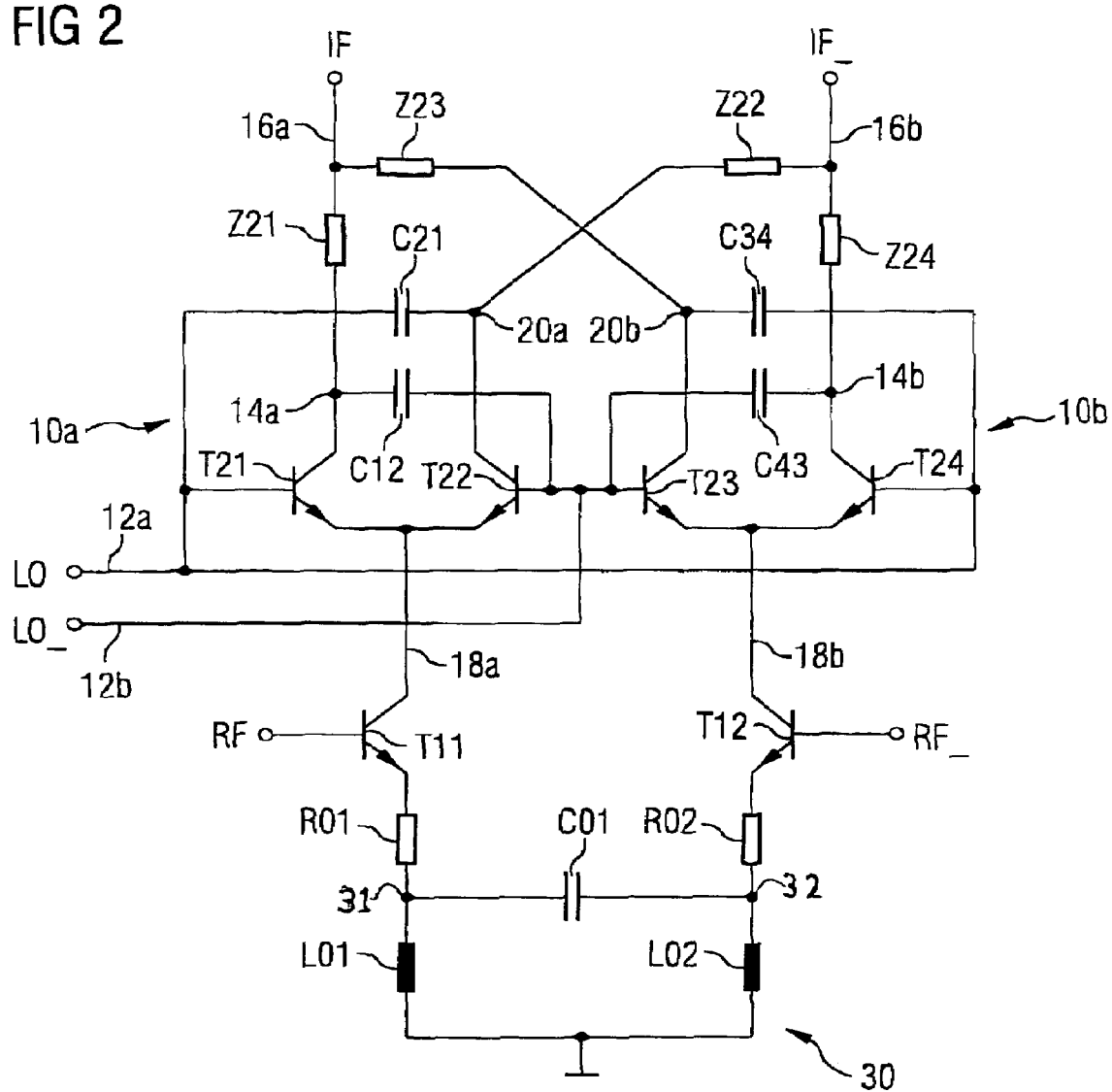
FIG. 2 shows a mixer with switch-supporting positive feedback capacitors and mirror suppression.

FIG. 2 shows a preferred embodiment of the present invention, in which, in addition to the switch-supporting positive feedback capacitors, the mixer circuit is also provided with mirror suppression. The mirror suppression is achieved by a resonator stage 30. In the preferred embodiment shown in FIG. 2, the resonator stage is implemented as PI circuit comprising two longitudinal branches and one transverse branch.

In the two longitudinal branches, there is arranged an inductance L01 and L02, respectively, as is to be seen in FIG. 2. In the transverse branch, there is arranged a capacitance C01. At each of the two nodes 31 and 32 at which the transverse branch is connected to the respective longitudinal branch, there is a resistive element, such as a resistor R01, R02, wherein these resistors are connected to the emitter terminals of the two transistors T11 and T12 of the RF supply stage. The resonator circuit for mirror frequency suppression which, with respect to its frequency selectivity, is sized so that a mirror frequency suppression occurs, is thus coupled resistively with the two transistors of the RF supply means. The resistive coupling is achieved with the linearization resistors R01 and R02.

Figure 3:
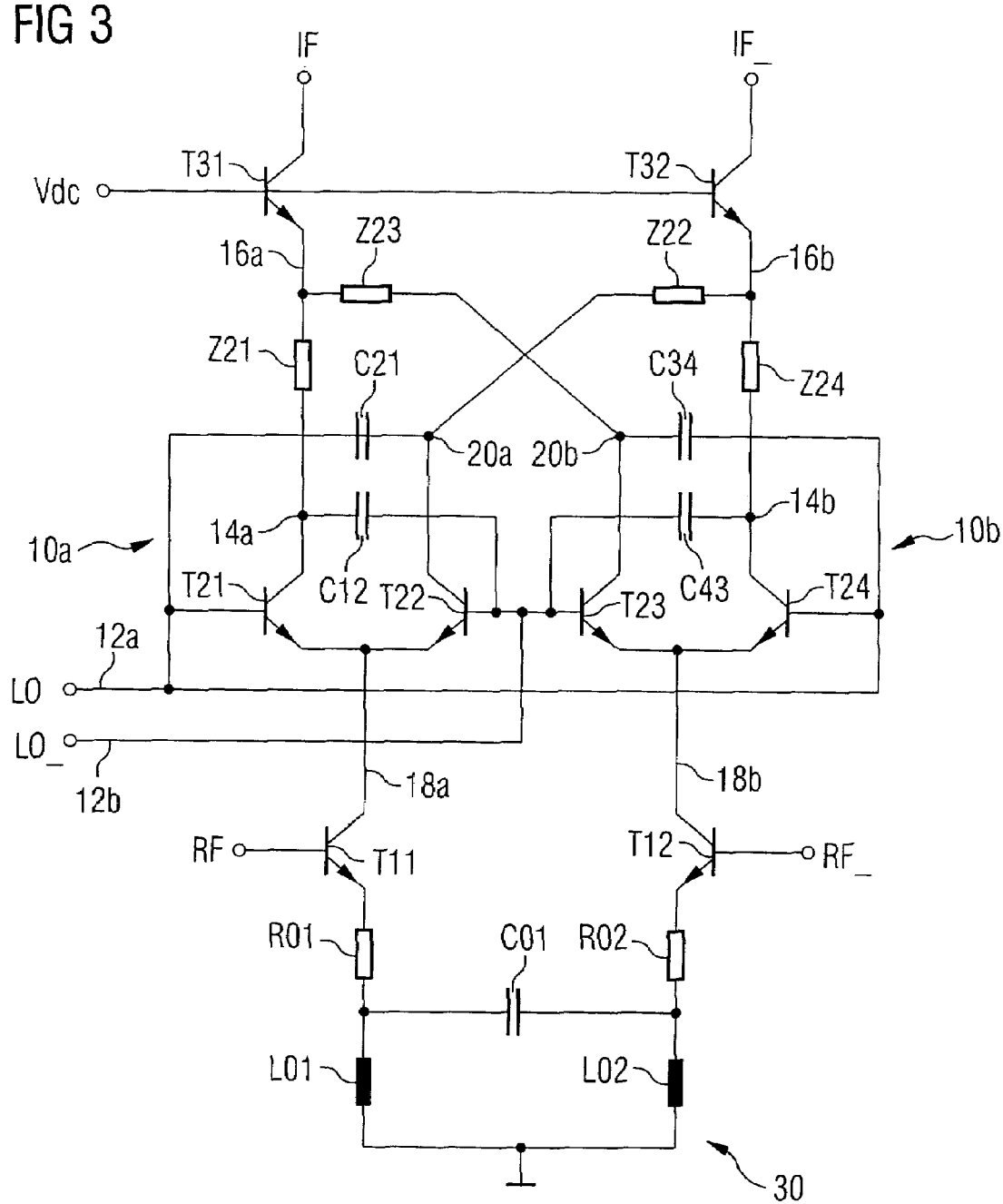
FIG. 3 shows a mixer with switch-supporting positive feedback capacitors and a first embodiment of cascoding and mirror suppression.

In the preferred embodiment shown in FIG. 3, the mixer circuit of FIG. 2 is complemented by a first manner of cascoding on the IF side. For this purpose, there is provided a first cascoding transistor T31 connected to the first IF output 16a of the first transistor circuit formed by the two transistors T21 and T22. There is further provided a second cascoding transistor T32 connected to the second IF output 16b associated with the second transistor circuit (formed by the transistors T23 and T24).

Figure 4:
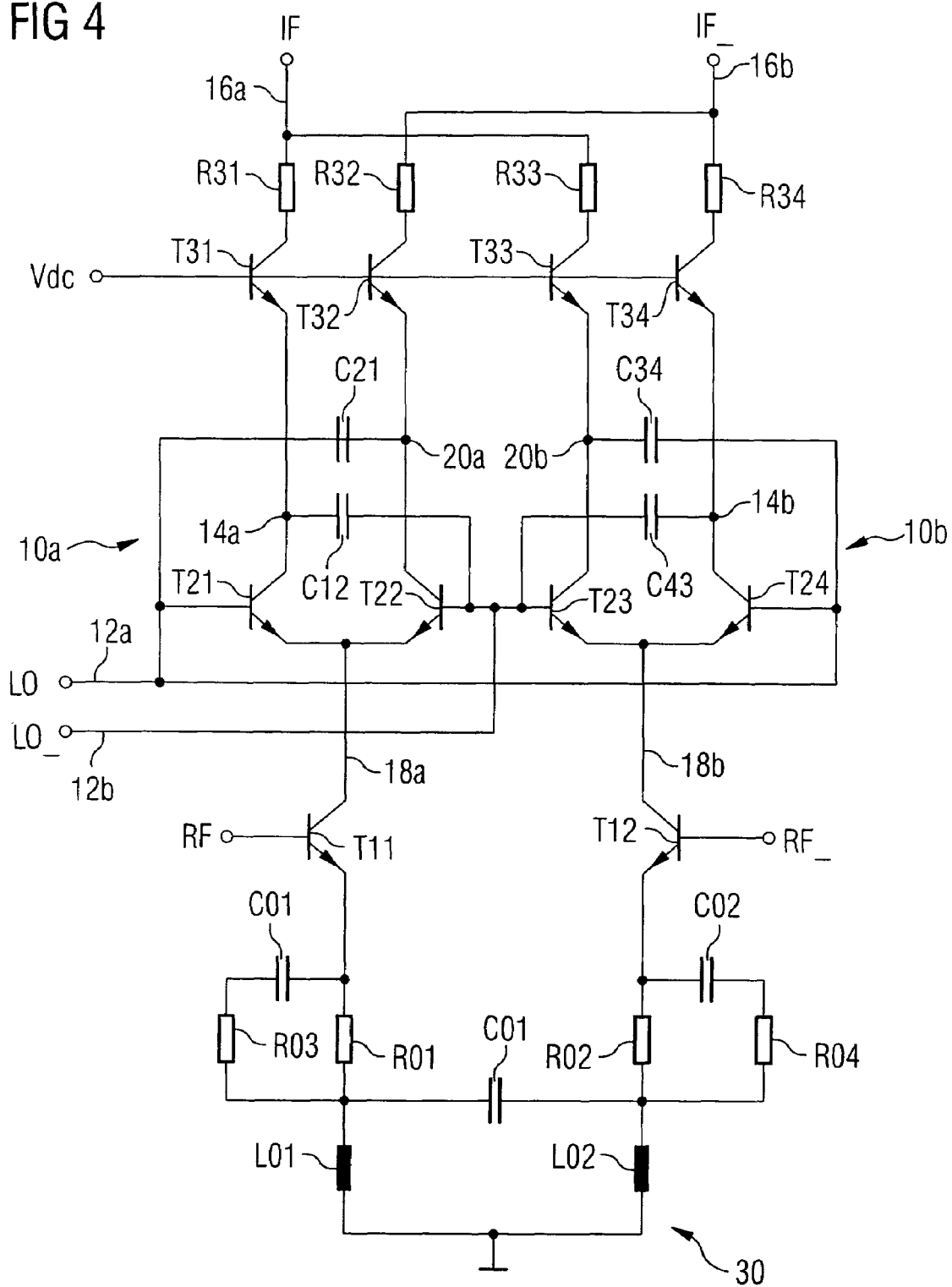
FIG. 4 shows a mixer with switch-supporting positive feedback capacitors and a second embodiment of cascoding and frequency response linearization.

FIG. 4 shows a further preferred embodiment of the present invention, in which the mixer circuit shown in FIG. 2 is provided with an alternative cascoding and, in addition, with a frequency response linearization.

The cascoding on the IF side is achieved such that the collector output of each transistor T21, T22, T23, T24 is connected to the corresponding IF output or inverted IF output via a cascode transistor, for example T31, T32, T33, T34, respectively, and a downstream resistor, for example R31, R32, R33, R34, respectively, as shown in FIG. 4. Furthermore, all cascoding transistors T31, T32, T33 and T34 are provided with preferably the same base voltage selected so that the corresponding transistors are in the open state.

The frequency response linearization is achieved by connecting a series circuit of a capacitor C01 and a resistor R03 each in parallel to the resistor R01 and by coupling a series circuit of a capacitor C02 and a resistor R04 each in parallel to the resistor R02 for resistive coupling of the RF and RF_ supply means and the mirror frequency suppression resonance stage. This achieves a frequency response linearization in that the frequency selectivity of the circuit is less in a certain range so that the circuit becomes more broadband.

As has been shown, all mixer circuits shown in the figures are designed strictly symmetrically. The symmetry axis is a vertical center axis in the respective figures. For reasons of symmetry and thus for reasons of freedom from distortion, it is preferred to size the respective elements corresponding to each other on both sides of the (imagined) symmetry axis identically. It is further preferred, as far as this is possible at all, to make the respective transistors corresponding to each other with respect to the symmetry axis as similar as possible within the unavoidable parameter variations.

A preferred embodiment of the present invention employs the mixer within a video tuner, wherein the elements are sized for frequencies occurring therein. In particular, the values of the capacitors C12, C21, C34, C43 should be in the range of 0.2 to 200 pF, and the values for the impedance elements Z21, Z23, Z22, Z24 should be in the range of 1 to 20 Ohm.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A mixer circuit configured to be coupled to a first local oscillator signal and a second local oscillator signal which is phase-shifted with respect to the first local oscillator signal, the mixer circuit comprising:
    a first transistor circuit with a first control input, a second control input, a first radio frequency input and a first intermediate frequency output, wherein a first local oscillator signal is applied to the first control input, wherein the second local oscillator signal is applied to the second control input;
    a second transistor circuit coupled to the first control input and the second control input and comprising a second radio frequency input for a radio frequency signal which is phase-shifted with respect to a radio frequency signal at the first radio frequency input of the first transistor circuit, and comprising a second intermediate frequency output for an intermediate frequency signal which is phase-shifted with respect to an intermediate frequency signal at the first intermediate frequency output;
    a first positive feedback element connected between a first intermediate node and the second control input;
    a second positive feedback element connected between a second intermediate node of the second transistor circuit and the second control input;
    a first impedance element connected between the first intermediate node and the first intermediate frequency output; and
    a second impedance element connected between the second intermediate node and the second intermediate frequency output.

2. The mixer circuit of claim 1, further comprising: a third positive feedback element connected between a third intermediate node and the first control input;
    a fourth positive feedback element connected between a fourth intermediate node of the second transistor circuit and the first control input;
    a third impedance element connected between the third intermediate node and the second intermediate frequency output; and
    a fourth impedance element connected between the fourth intermediate node and the first intermediate frequency output.

3. The mixer circuit of claim 1, wherein the positive feedback elements comprise at least a capacitive portion.

4. The mixer circuit of claim 1, wherein the impedance elements comprise at least a resistive portion.

5. The mixer circuit of claim 1, wherein the positive feedback elements have substantially equivalent nominal values, and the impedance elements have substantially equivalent nominal values.

6. The mixer circuit of claim 1, further comprising: a radio frequency supply stage with a first output for the radio frequency signal and a second output for the radio frequency signal which is phase-shifted with respect to said radio frequency signal and has the same frequency as said radio frequency signal.

7. The mixer circuit of claim 6, wherein the radio frequency supply stage comprises a transistor stage with a first and a second transistor and a resonator stage, wherein the resonator stage is coupled between the transistor stage and circuit ground.

8. The mixer circuit of claim 7, wherein the resonator stage is coupled with the transistor stage via resistors.

9. The mixer circuit of claim 7, wherein the resonator stage comprises a Pi circuit with a transverse branch and two longitudinal branches, wherein an inductance is arranged in each longitudinal branch and a capacitance is arranged in the transverse branch.

10. The mixer circuit of claim 1, wherein the first intermediate frequency output is coupled to a first cascoding transistor, wherein the second intermediate frequency output is coupled to a second cascoding transistor, wherein a control signal for the cascoding transistors is adjustable to maintain the cascoding transistors in a conductive state.

11. The mixer circuit of claim 1, wherein each of the first and the second transistor stages comprises two transistor units, wherein the first control input is connected to a respective first transistor unit, and wherein the second control input is connected to a respective second transistor unit.

12. The mixer circuit of claim 7, wherein the resonator stage is coupled to the transistor stage via a resistive coupling unit, wherein, for each transistor, the resistive coupling unit comprises a parallel circuit of a first resistor and a series circuit of a second resistor and a capacitive element.

13. The mixer circuit of claim 1, wherein a first cascoding transistor is arranged between the first intermediate node and the first impedance element, and wherein a second cascoding transistor is arranged between the second intermediate node and the second impedance element.

14. The mixer circuit of claim 2, wherein a first cascoding transistor is arranged between the third intermediate node and the third impedance element, and wherein a second cascoding transistor is arranged between the fourth intermediate node and the fourth impedance element.

15. The mixer circuit of claim 2, wherein the first positive feedback element, the second positive feedback element, the third positive feedback element or the fourth positive feedback element is implemented as discrete capacitor or as capacitively acting line.

16. The mixer circuit of claim 1, wherein the transistor circuits comprise exclusively bipolar transistors.

17. A mixer circuit for coupling to a first local oscillator signal and a second local oscillator signal which is phase-shifted with respect to the first local oscillator signal, the mixer circuit comprising:

a first transistor circuit having a first input coupled to the first oscillator signal and a second input coupled to the second oscillator signal, a first radio frequency input and a first intermediate frequency output;

a second transistor circuit having a third input coupled to the first oscillator signal, a fourth input coupled to the second oscillator signal, a second radio frequency input for a radio frequency signal which is phase-shifted with respect to a radio frequency signal at the first radio frequency input of the first transistor circuit, and a second intermediate frequency output for an intermediate frequency signal which is phase-shifted with respect to an intermediate frequency signal at the first intermediate frequency output;

a first capacitive feedback element connected between a first intermediate node coupled to the first intermediate frequency output and the second control input; and a second capacitive feedback element connected between a second intermediate node coupled to the second intermediate frequency output of the second transistor circuit and the second control input.

18. The mixer circuit of claim 17 further comprising:

a first impedance element connected between the first intermediate node and the first intermediate frequency output; and a second impedance element connected between the second intermediate node and the second intermediate frequency output.

19. The mixer circuit of claim 18 further comprising:

a third capacitive feedback element connected between a third intermediate node and the first control input; and a fourth capacitive feedback element connected between a fourth intermediate node of the second transistor circuit and the first control input.

20. The mixer circuit of claim 19 further comprising:

a third impedance element connected between the third intermediate node and the second intermediate frequency output; and a fourth impedance element connected between the fourth intermediate node and the first intermediate frequency output.

* * * * *